United States Patent
Fujii et al.

(10) Patent No.: US 6,448,688 B2
(45) Date of Patent: Sep. 10, 2002

(54) HARD CARBON FILM AND SURFACE-ACOUSTIC-WAVE SUBSTRATE

(75) Inventors: Satoshi Fujii; Tomoki Uemura; Yuichiro Seki; Hideaki Nakahata; Shinichi Shikata, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/739,210

(22) Filed: Dec. 19, 2000

Related U.S. Application Data

(62) Division of application No. 09/400,193, filed on Sep. 21, 1999.

(30) Foreign Application Priority Data

Oct. 30, 1998 (JP) .......................................... 10-326110

(51) Int. Cl.[7] .............................................. H01L 41/08
(52) U.S. Cl. ............................... 310/313 A; 310/313 R
(58) Field of Search ........................ 310/313 A, 313 R

(56) References Cited

U.S. PATENT DOCUMENTS

| | | | | |
|---|---|---|---|---|
| 5,329,208 A | * | 7/1994 | Imai et al. ................... | 310/313 |
| 5,426,340 A | * | 6/1995 | Haigaki et al. ............. | 310/313 |
| 5,565,724 A | * | 10/1996 | Hachigo et al. ............ | 310/313 |
| 5,587,013 A | | 12/1996 | Ikegaya et al. | |
| 5,646,468 A | * | 7/1997 | Nakahata et al. ........... | 310/313 |
| 5,736,226 A | | 4/1998 | Tanabe et al. | |
| 5,776,246 A | | 7/1998 | Tanabe et al. | |
| 5,855,998 A | | 1/1999 | Tanabe et al. | |

FOREIGN PATENT DOCUMENTS

| | | |
|---|---|---|
| JP | 4-354873 | 12/1992 |
| JP | 5-90874 | 4/1993 |
| JP | 5-320911 | 12/1993 |
| JP | 6-232677 | 8/1994 |
| JP | 6-316492 | 11/1994 |
| JP | 7-45748 | 2/1995 |
| JP | 7-215795 | 8/1995 |
| JP | 9-71498 | 3/1997 |
| JP | 10-87396 | 4/1998 |

OTHER PUBLICATIONS

"WC–Co Cutting Tool Inserts with Diamond Coatings," by Silva et al., Diamond and Related Materials, vol. 8 (1999), pp. 1913–1918.
"Re–examination of the Raman Lineshapes of Diamond Films Grown by Hot–Filament or Microwave–Plasma Chemical Vapor Deposition," by Robins et al., SPIE vol. 1759 Diamond Optics V (1992), pp. 70–77.
Ceramics, vol. 27, No. 3 (1992), pp. 219–225.
"Growth of Diamond Thin Films by Hot Filament CVD and Electron Assisted CVD," by Sawabe, The Journal of the Surface Finishing Society of Japan, vol. 42, No. 12 (1991), pp. 1185–1188.
"Raman Scattering from sp2 Carbon Clusters," by Yoshikawa et al., Physical Review B, vol. 46, No. 11 (Sep. 15, 1992), pp. 7169–7174.
"Mechanical Properties of Diamond Thin Prepared by Chemical Vapour Deposition," by Seino et al., Journal of Materials Science Letters, vol. 11 (1992), pp. 515–517.
"Density and Elastic Constants of Hot–Filament–Deposited Polycrystalline Diamond Films: Methane Concentration Dependence," by Kuschnereit et al., Thin Solid Films, vol. 312 (1998), pp. 66–72.

* cited by examiner

Primary Examiner—Archene Turner
(74) Attorney, Agent, or Firm—McDermott, Will & Emery

(57) ABSTRACT

The invention offers a hard carbon film and a SAW substrate that are easy to fabricate or low in manufacturing cost while virtually maintaining the quality that affects the important properties of a device that comprises the hard carbon film or the SAW substrate. The hard carbon film comprises a composite film of graphite-like diamond and carbon clusters; the composite film has a continuous crystal structure.

3 Claims, 22 Drawing Sheets

Integration range for Id: P1 (1332) ± 5 cm⁻¹

Integration range for Ic: P2 (1515) ± 35 cm⁻¹

P1&P2: Raman shift at which the peak value lies

Definition of the ratio of the intensity of carbon clusters to that of diamons

Coexistence of graphite-like diamonds and carbon clusters between the diamond grains Orientation ratio of the graphite-like diamons of the present invention

FIG. 8(a)

Formation of the hard carbon film by filament CVD

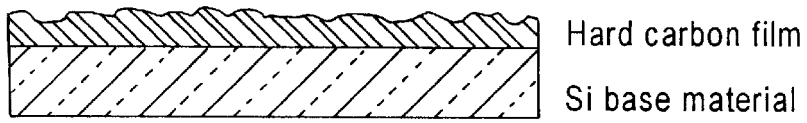
Hard carbon film
Si base material

FIG. 8(b)

Polishing of the hard carbon film by a diamond grinding wheel

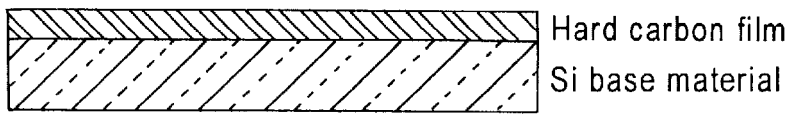
Hard carbon film
Si base material

FIG. 8(c)

Formation of a ZnO film by a spattering apparatus

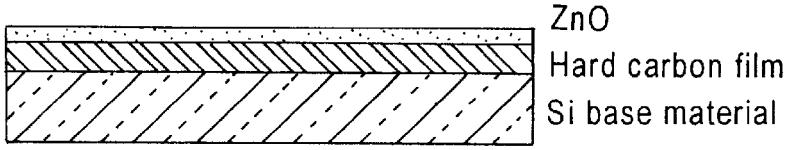
ZnO
Hard carbon film
Si base material

FIG. 8(d)

Formation of an A1 film by a spattering apparatus

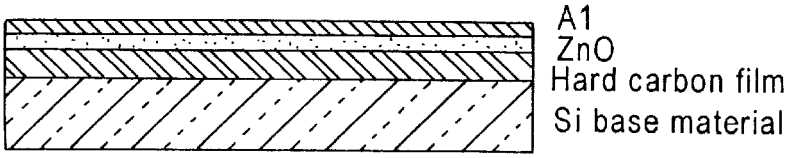
A1
ZnO
Hard carbon film
Si base material

FIG. 8(e)

Formation of electrodes by photolithography

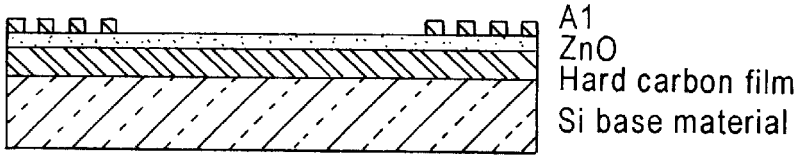
A1
ZnO
Hard carbon film
Si base material

Magnification: 1KX

Magnification: 3KX

Magnification: 10KX

Magnification: 3KX

Magnification: 10KX

HARD CARBON FILM AND SURFACE-ACOUSTIC-WAVE SUBSTRATE

This is a Divisional of application Ser. No. 09/400,193 filed Sep. 21, 1999.

BACKGROUND OF THE INVENTION

1. Field of the Invention

The present invention relates to a hard carbon film that comprises graphite-like diamond and carbon clusters and to a surface-acoustic-wave (SAW) substrate that comprises a base material, the hard carbon film mounted on the base material, and a piezoelectric layer mounted on the hard carbon film.

The hard carbon film of the present invention is suitable for wide use in electronic parts and electronic materials in general, such as a low-cost heatsink for mounting lasers on it, and the SAW substrate of the present invention is particularly suitable for use in SAW devices.

2. Description of the Background Art

Lithium niobate( LNO), lithium tantalate (LTO), crystal, sapphire, and ZnO have been used as the material for SAW substrates. Single-crystalline diamond, C-BN, AlN, Cu, and Al have been used as the material for heatsinks.

With the material for SAW use, the fabrication of high-frequency SAW filters by the use of a conventional material, such as crystal, requires the technology for miniscule-wiring of 1 $\mu$m or below, especially sub- $\mu$m or below, causing a serious problem of yield reduction resulting from breaks and short circuits in wiring. In addition, the implementation of the miniscule-wiring technology requires the provision of a large-scale clean room and a large volume of investment.

A highly crystalline diamond allows easy development of surface unevenness caused by the protrusion of the crystal's (111) and (100) facets, making it extremely difficult to obtain surface evenness by polishing. The diamond is prone to grow to a grain size of 5 $\mu$m or more, which is responsible for the propagation loss when a high-frequency device is fabricated on the diamond surface.

SAW devices for 1.0 GHz or higher with a piezoelectric-body/diamond laminated structure have a problem that they cause comparatively great propagation loss when used for a device such as a filter, although their operating frequency is on a satisfactory level. At such a high frequency, the wavelength becomes short and thereby increases the effect of microscopic surface unevenness of the piezoelectric body on the propagation loss and enlarges the scattering of surface waves at grain boundaries. Since diamond is harder than any other substance, it is difficult to obtain a film with sufficient surface evenness.

Diamond-like carbon, which transmits sound waves at a speed comparable to that of diamond, allows easy production of an even film. However, it permits facile evaporation of carbon into vacuum during the formation of a piezoelectric body, so that devices comprising the carbon have been difficult to fabricate.

With the material for heatsinks, ultra-high-pressure single-crystalline diamonds are high in cost, although they have high thermal conductivity. Consequently, adequate heat conductive materials have been required which are low in cost or allow easy fabrication.

At present, it is difficult to obtain single-crystalline diamonds by chemical vapor deposition (CVD). Inevitably, diamond films obtained by CVD are polycrystalline films, which have grain boundaries. Because the grain boundaries scatter surface waves, SAW filters comprising the diamond films obtained by CVD have tended to deteriorate in performance.

SUMMARY OF THE INVENTION

An object of the present invention is to offer a hard carbon film and a SAW substrate that are free from the drawbacks such as those of the above-described prior art.

Another object of the present invention is to offer a hard carbon film and a SAW substrate that are easy to fabricate and are low in manufacturing cost while virtually maintaining the quality that affects the important properties of a device that comprises the hard carbon film or the SAW substrate.

Yet another object of the present invention is to offer a hard carbon film and a SAW substrate that are low in propagation loss when used in SAW devices.

The present inventors, through intensive experiments and studies, have found that a graphite-like diamond/carbon-clusters composite film that has a specific characteristic is highly effective to achieve the above-described objects.

The hard carbon film of the present invention is based on the above finding. More specifically, it comprises a composite film of graphite-like diamond and carbon clusters, and the composite film has a continuous crystal structure.

The present inventors consider that the hard carbon film of the present invention having the above-described constitution is composed of graphite-like diamond constituting the bulk, desirably 90% or more, of the hard carbon film and carbon clusters filling the interstices between the diamond grains.

Conventional SAW filters have allowed the scattering of surface waves at the diamond grain boundaries as an inevitable consequence, causing the propagation loss. On the other hand, the hard carbon film of the present invention has a low propagation loss comparable to the level that has been considered to be attainable only by a single-crystalline diamond (not attainable by polycrystalline diamonds). This reduction in propagation loss is attributed to the structure of the hard carbon film; i.e., the continuity of the crystal structure is maintained at a level comparable to that in a single crystal because the diamond crystal grains are similar to graphite and the interstices between the diamond grains are filled with carbon clusters.

The hard carbon film of the present invention has a level equivalent to diamond in terms of physical properties and hardness, and therefore transmits SAWs at a speed comparable to that in high-quality diamonds. The hard carbon film facilitates the attainment of a highly even surface, 1 nm or less in surface roughness (Ra), by polishing with a simple diamond grinding wheel because it has few (111) planes of diamond in a plane parallel to the base material and because its crystals are not perfect diamond cystals.

Consequently, the hard carbon film of the present invention, when used in SAW filters, facilitates the growth of a highly flat, high-quality film of a piezoelectric body, which is an essential member of a SAW filter, on the hard carbon film.

As described above, the present ,invention offers a hard carbon film that comprises a composite film of graphite-like diamond and carbon clusters, the composite film having a continuous crystal structure.

When analyzed by Raman spectroscopy, the hard carbon film of the present invention has a diamond peak of which the peak value lies at a Raman shift of 1332 cm$^{-1}$ or more, desirably in the range of 1333 to 1335 cm$^{-1}$. The peak has a full width at half maximum (FWHM) of 6 cm$^{-1}$ or more. The hard carbon film has only one carbon-cluster peak at a Raman shift of 1500 to 1520 cm$^{-1}$ in the range of 1400 to 1700 cm$^{-1}$. The peak has an FWHM of 170 cm$^{-1}$ or less. The hard carbon film further has an Ic/Id ratio of 4 or more, where Ic means the integrated intensity of the carbon-cluster peak and Id means the integrated intensity of the diamond peak in the Raman spectrum.

The present inventors consider that the hard carbon film of the present invention having the above-described Raman spectroscopic properties has a composite structure in which the bulk, 90% or more, for example, of the hard carbon film is constituted by graphite-like diamond, and the interstices between the diamond grains are filled with carbon clusters.

The present inventors found that the hard carbon film of the present invention having the appropriate percentage of the carbon clusters as described above facilitates the formation of a highly even mirror-finished surface by polishing the film.

The conventional multicrystalline-diamond films have conspicuous grain boundaries. The interstices between these diamond grains are either vacant or filled with graphite. Even in the latter case, the discontinuity of the crystal structure is inevitable. Therefore, when these multicrystalline-diamond films are used in SAW filters, surface waves are scattered at the grain boundaries. As a result, the films are not suitable for use in the substrates for SAW filters. On the other hand, when the hard carbon film of the present invention is used as a component of the substrate for a SAW device, the decrease in SAW propagation velocity can be prevented without the practical reduction in the surface hardness of the hard carbon film because of the above-described properties of the hard carbon film.

As described above, the present invention offers a hard carbon film that is easy to fabricate or low in manufacturing cost while virtually maintaining the quality that affects the important properties of a device that comprises the hard carbon film. The hard carbon film has the great advantage of low propagation loss when used in the substrate for SAW devices in particular.

BRIEF DESCRIPTION OF THE DRAWINGS

In the drawings:

FIG. 8(a), 8(b), 8(c), 8(d), and 8(e) are a series of schematic cross sections showing the forming process of Al electrodes/ZnO layer/hard carbon layer/Si base-material composites fabricated in Example 1.

DETAILED DESCRIPTION OF THE INVENTION

Figure 1:
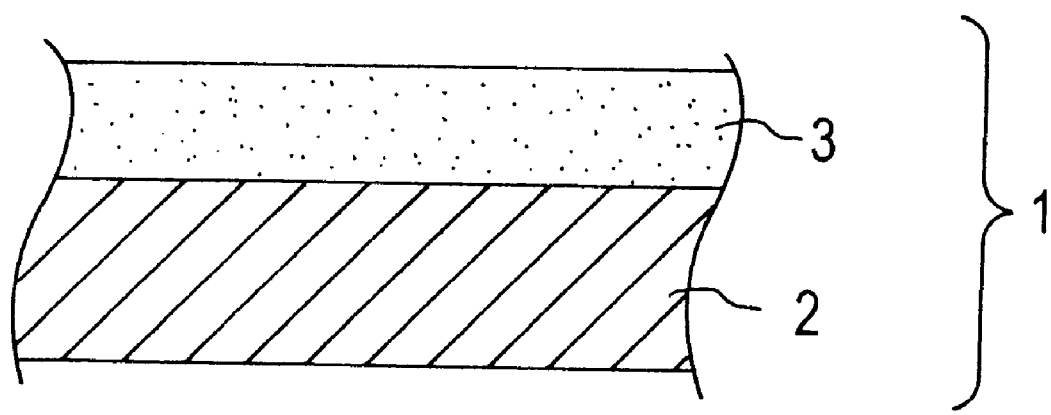
FIG. 1 is a schematic cross section showing a basic embodiment of a hard carbon substrate 1 having the hard carbon film 3 of the present invention mounted on a base material 2.

The present invention is explained more specifically in the following, referring to the drawings as required. In the following description, the term denoting the ratio of amount "%" is used on a "mol" basis, i.e., "mol %" unless otherwise specified.

Hard Carbon Film

The hard carbon film of the present invention comprises a composite film of graphite-like diamond and carbon clusters, and the composite film has a continuous crystal structure.

Confirmation of the Presence of the Graphite-like diamond

The presence of the graphite-like diamond in the hard carbon film of the present invention can be confirmed by the fact that the FWHM of the diamond peak in the vicinity of 1333 cm$^{-1}$ is 6 cm$^{-1}$ or more in Raman spectroscopy.

The FWHM of the diamond peak in the vicinity of 1333 cm$^{-1}$ observed in Raman spectroscopy usually has a magnitude of 3 to 4 cm$^{-1}$ and tends to decrease with increasing the strength of the diamond-to-diamond bond (sp$^3$, known as the diamond bonding). Increase in FWHM means the decrease in Raman scattering from the $sp^3$ bonds; that is, one or two bonds are broken in the diamond bonding, increasing the sp or $sp^2$ bonds. Because the sp and $sp^2$ bonds are the bonds that correspond to graphite bonding, the present invention adopts the criterion "the FWHM of the diamond peak in the vicinity of 1333 $cm^{-1}$ is 6 $cm^{-1}$ or more in Raman spectroscopy" as a means for confirming the presence of the diamonds having the properties of graphite, the graphite-like diamond.

Confirmation of the Presence of the Carbon Clusters

The presence of the carbon clusters in the hard carbon film of the present invention can be confirmed by the fact that "the carbon-cluster peak lies at 1510 $cm^{-1}$ in Raman spectroscopy."

Yoshikawa et al. have disclosed that when boron is ion-injected into glassy carbon, the usually observable two peaks (at 1355 $cm^{-1}$ and 1590 $cm^{-1}$) of the glassy carbon in Raman spectroscopy converge into one peak at 1550 $cm^{-1}$. (See M. Yoshikawa et al., *Physical Review*, 46 (11) p.7169, 1992.) This convergence occurs when the graphite's crystal structure constitutes the minority.

This study has suggested that the quantity of the carbon clusters can be determined by the number of peaks and the position of the peaks in a Raman spectrum.

Referring to the above-mentioned literature, the present inventors conclude that when only one peak is present in the vicinity of 1510 $cm^{-1}$ and the FWHM of the peak is 170 $cm^{-1}$ or less resulting from the overlapping of the two peaks, the majority of the film is constituted by clusters of 2 to 5 carbon atoms.

The above description "only one peak is present in the vicinity of 1510 $cm^{-1}$ and the peak's FWHM is 170 $cm^{-1}$ or less" indicates that the hard carbon film of the present invention includes a large number of graphite structures smaller than those reported in the literature by Yoshikawa et al. The quantity of "carbon clusters" can be determined by multiplying the intensity of the diamond peak in the Raman spectrum by 60 because the intensity of carbon-cluster peak in the Raman spectrum is 60 times that of diamond peak.

Confirmation of the Continuity of the Crystal Structure

According to the present invention, "the continuity of the crystal structure in the composite film" can be confirmed by the fact that "the FWHM of the peak at 1510 $cm^{-1}$ is 170 $cm^{-1}$ or less."

As described above, the FWHM of the peak at 1510 $cm^1$ in the Raman spectrum indicates the degree of overlapping of the two peaks (which originally appear at 1355 and 1590 $cm^{-1}$), i.e., the percentage of the carbon clusters in the composite film.

The following three observations indicate that the continuity of the crystal structure is maintained in the hard carbon film of the present invention:

(a) The FWHM of the diamond peak in the vicinity of 1333 $cm^{-1}$ is 6 $cm^{-1}$ or more in the Raman spectrum. This means that the diamond bonding includes sp and $sp^2$ bonds to a certain extent.

(b) The FWHM of the graphite (carbon cluster) peak at 1510 $cm^{-1}$ is 170 $cm^{-1}$ or less. This means that the bulk of the graphite is composed of carbon clusters, the bonding of which is typified by sp and sp bonds.

(c) Observations by an SEM show that the interstices between the diamond grains are filled with carbon clusters.

The continuity of the crystal structure can be explained by the following analogy: Glass, which is amorphous, transmits light well because it has the continuity of the crystal structure free from voids or single crystals. This explanation is applicable to the interaction between the hard carbon film of the present invention and surface acoustic waves.

This "continuity of the crystal structure" can also be confirmed directly by an image through an SEM. The applicable conditions of and observations by the SEM are shown below.

Applicable Conditions of and Observations by the SEM

Observations are conducted by using a Hitachi-made S-800 SEM under the electron beam-generating conditions of 5 kV and 10 μA.

Figure 18:
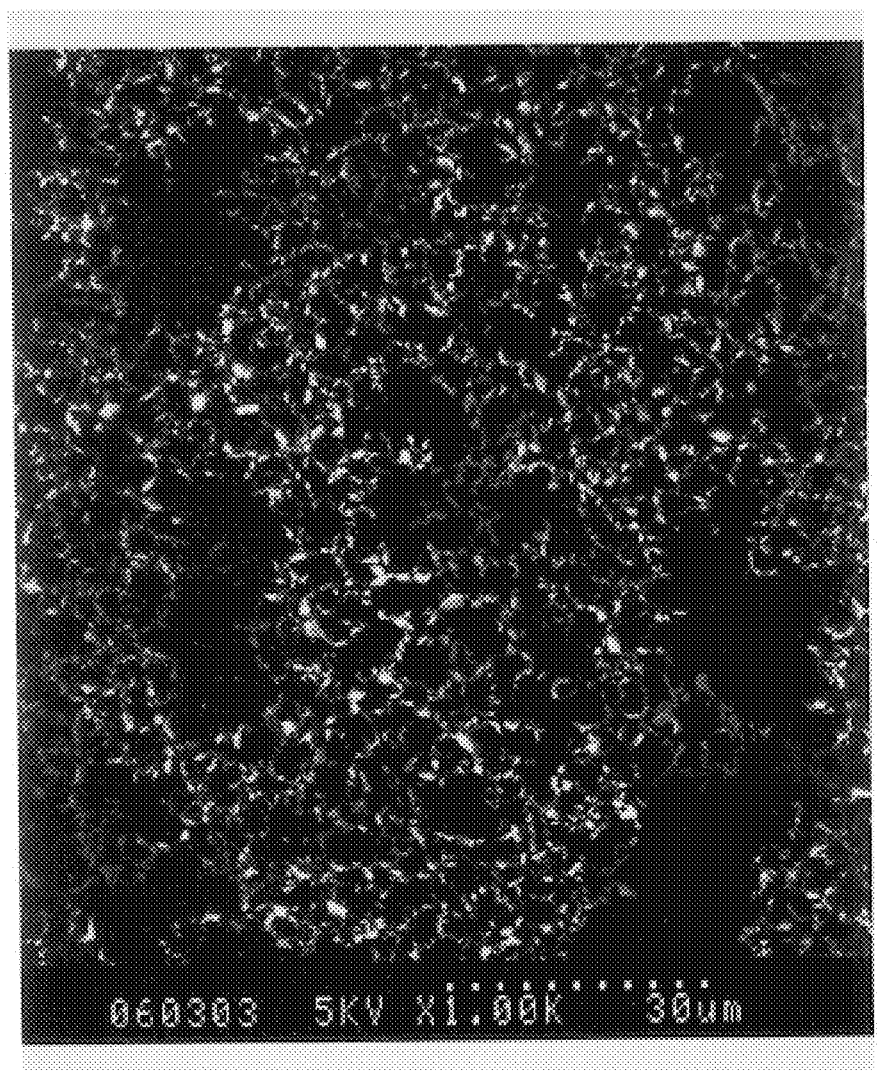
FIG. 18 is an scanning electron microscope (SEM) micrograph showing an example of the polished surface of a graphiteless diamond film obtained by CVD (magnification: 1 KX=1,000X).
Figure 19:
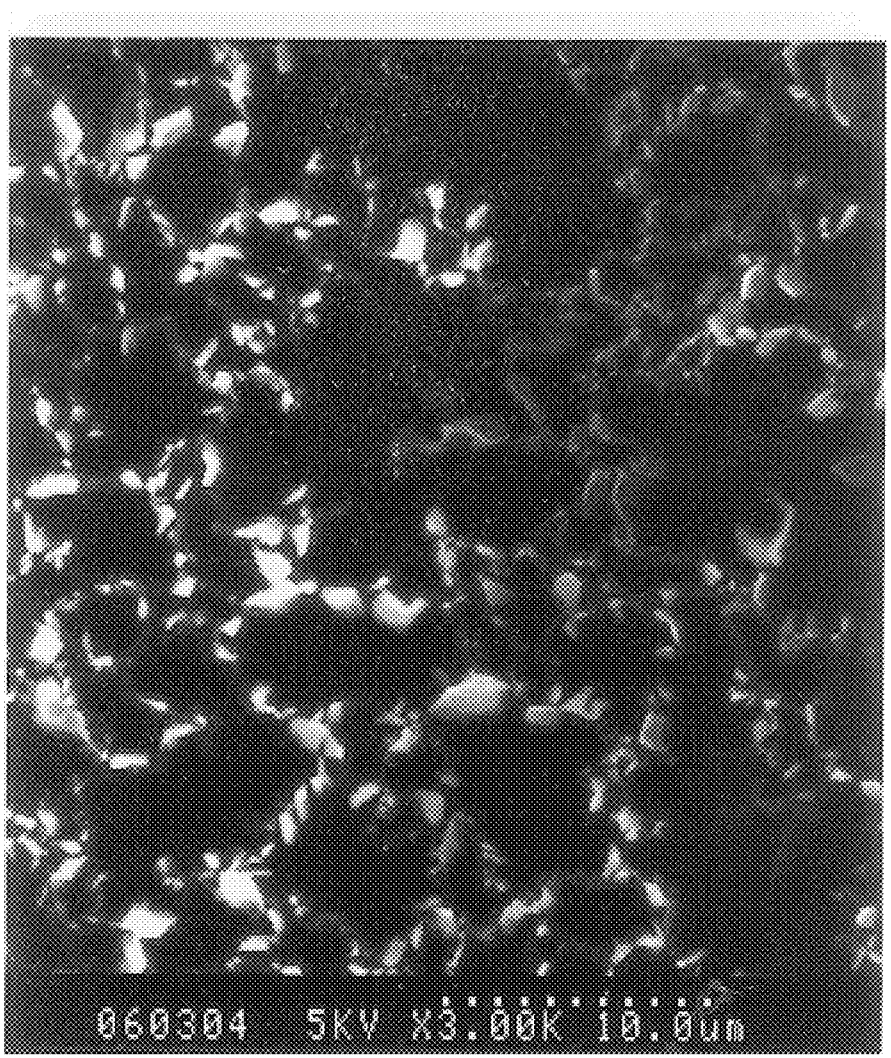
FIG. 19 is an SEM micrograph showing a surface similar to that in FIG. 18 (magnification: 3 KX=3,000X).
Figure 20:
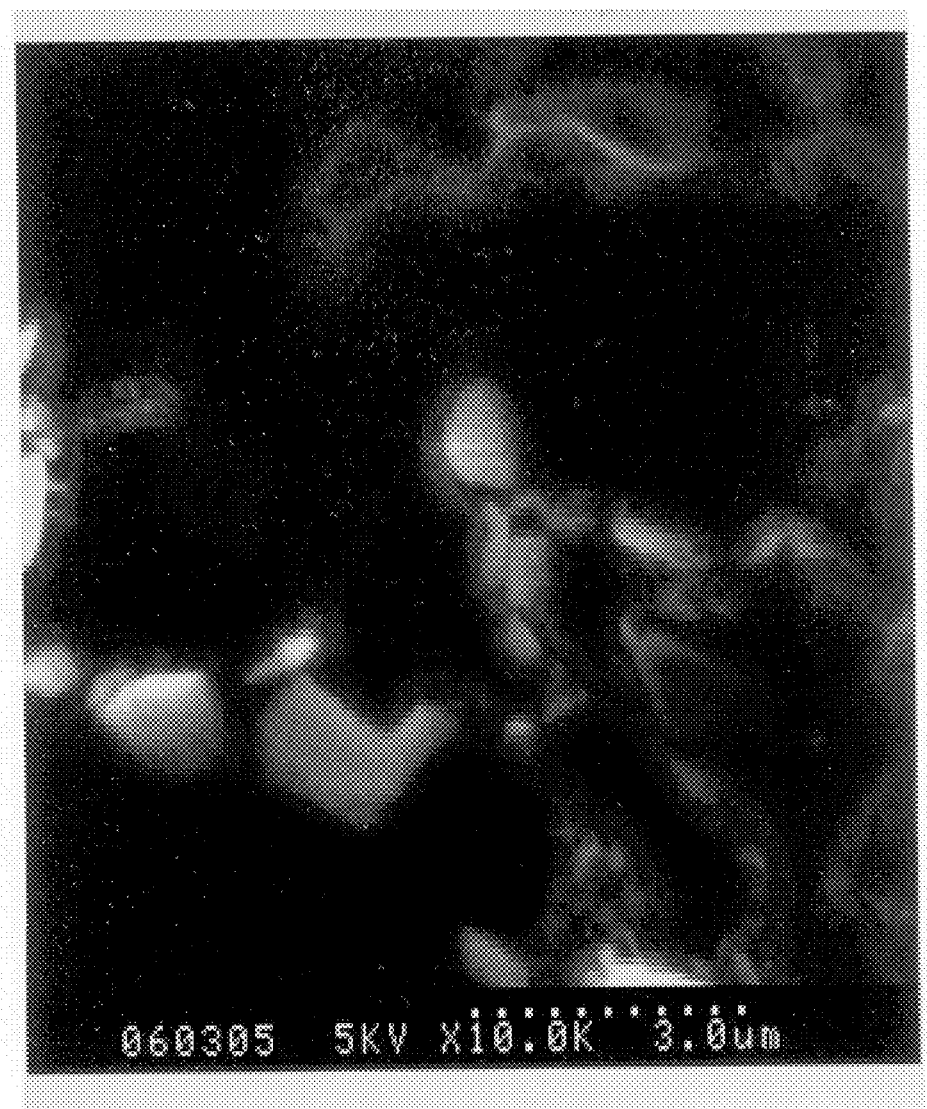
FIG. 20 is an SEM micrograph showing a surface similar to that in FIG. 18 (magnification: 10 KX=10,000X).

FIGS. 18 to 20 are SEM micrographs showing the polished surface of a diamond film, which has no carbon clusters, obtained by CVD. In these micrographs, the absence of carbon clusters between the diamond grains makes the grain boundaries conspicuous in white. The diamond grains are charged up, displaying grain boundaries.

Figure 21:
FIG. 21 is an SEM micrograph showing an example of a hard carbon film having carbon clusters between the diamond grains, i.e., the hard carbon film of the present invention (magnification: 3 KX=3,000X).
Figure 22:
FIG. 22 is an SEM micrograph showing a surface similar to that in FIG. 21 (magnification: 10 KX=10,000X).

FIGS. 21 and 22 are similar SEM micrographs of a hard carbon film having carbon clusters between the diamond grains, i.e., the hard carbon film of the present invention. In these micrographs, the presence of the carbon clusters between the diamond grains makes the contrast at the grain boundaries disappear because the carbon clusters have a crystal structure similar to that of the diamond grains.

Embodiment of a Hard Carbon Film Mounted on a Base Material

FIG. 1 is a schematic cross section showing an embodiment of a hard carbon substrate having the hard carbon film of the present invention mounted on a base material. Referring to FIG. 1, the hard carbon substrate 1 comprises a base material 2 made of a semiconductor material, for example, and a hard carbon film 3 mounted on the base material 2.

Base Material

The base material 2 has no limitations on its material (metals, semiconductors, for instance), thickness, and surface conditions (such as roughness) provided that the hard carbon film 3 can be mounted on it. More specifically, semiconductor materials such as Si, SiC, GaAs, and AlN are suitable as the material in terms of easy fabrication of electronic devices. Metals such as molybdenum and stainless steel also can be used.

When Si is used as the material for the base material 2, it is desirable that the Si base material have a facet orientation of (100), (110), or (111). Of these orientations, the orientation (100) is preferable because the cleavage surface is easily obtainable.

Hard Carbon Film

It is desirable that the hard carbon film 3 of the present invention to be mounted on the base material 2 satisfy the following condition with regard to the proportion of the quantity between the graphite-like diamond and carbon clusters:

$$Ic/Id \geq 4,$$

where Id: the integrated intensity of the peak of the graphite-like diamond, Id being determined by the integration of the Raman spectrum over the range of P1±5 cm$^{-1}$, where P1 is the Raman shift at which the peak value lies, P1 lying in the range of 1333 to 1335 cm$^{-1}$, the intensity of the diamond peak in the vicinity of 1333 cm$^{-1}$ in Raman spectroscopy.

Ic: the integrated intensity of the peak of the carbon clusters, Ic being determined by the integration of the Raman spectrum over the range of P2±35 cm$^{-1}$, where P2 is the Raman shift at which the peak value lies, P2 lying in the range of 1500 to 1520 cm$^{-1}$.

Peak Corresponding to Crystalline Diamond

Figure 2:
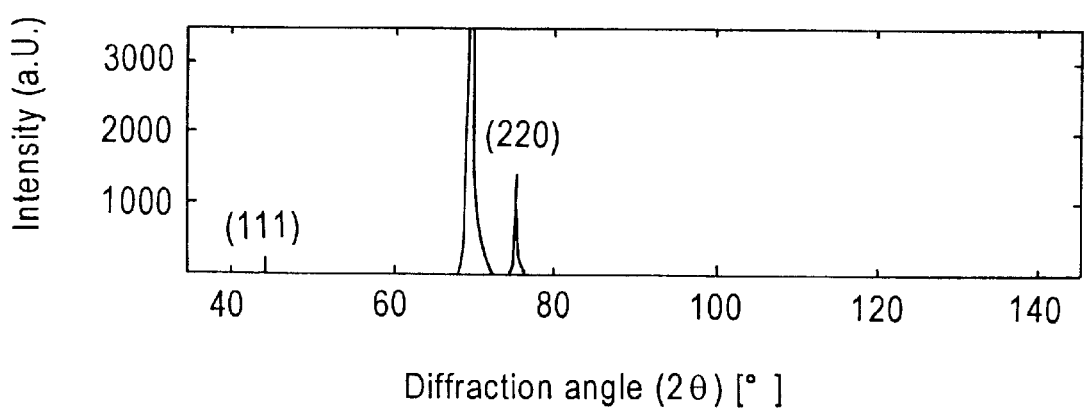
FIG. 2 is a chart showing an example of a spectrum obtained by X-ray diffraction of the hard carbon film of the present invention.

The hard carbon film 3 of the present invention exhibits the peak corresponding to the crystalline diamonds in X-ray diffraction. An example of such an X-ray diffraction spectrum is shown in FIG. 2.

In the above-mentioned X-ray diffraction, the conditions described below are suitable for the determination of the plane parallel to the base material (a majority plane on the surface) by the 2θ-θ method. Conditions of X-ray diffraction:

X-ray tube: revolving-cathode-pair X-ray tube,

X-ray diffraction equipment: Rigakusha-made, brand name: RINT-1500,

Target: Cu target,

Tube voltage: 50 kV, and

Tube current: 32 mA.

Measurements from 250 to 1450 are conducted by the 2θ-θ method under these conditions to obtain the intensity of the peaks corresponding to the (111), (220), (311), (400), and (331) planes of diamond so that the presence of these planes can be ascertained.

Presence or Absence of Diamond Peaks

The intensity of the above-described diamond peaks is expressed as a value relative to the reference intensity of 10 of the background level in the X-ray diffraction spectrum obtained by the above analysis. When the relative intensity of a peak is 10,000 or more, the peak is judged to be present.

The peak intensity is determined by the procedure described below. For example, the intensity of the peak corresponding to the (111) plane is determined by the integration of the X-ray-diffraction result over the range of P3±1°, where P3 is the diffraction angle at which the peak value lies; P3 lies in the range of 43 to 46°. The value obtained by the integration is expressed as I(111).

Similarly, the intensity of the peak corresponding to the (220) plane is determined by the integration of the X-ray-diffraction result over the range of P4±1°, where P4 is the diffraction angle at which the peak value lies; P4 lies in the range of 73 to 76°. The value obtained by the integration is expressed as I(220). In the present invention, it is desirable that the ratio of the integrated intensity I(111)/I(220) be 0.3 or less, preferably between 0.05 and 0.2 inclusive, in terms of the proportion of the quantity between the graphite-like diamond and carbon clusters.

Raman Spectroscopy

The hard carbon film 3 of the present invention exhibits an FWHM of 6 cm$^{-1}$ or more when the FWHM of the diamond peak in the vicinity of 1333 cm$^{-1}$ in Raman spectroscopy is subjected to fitting with the Lorentz resonance curve. The hard carbon film 3 also has the peak of the carbon clusters in the vicinity of 1515 cm$^{-1}$ in Raman spectroscopy. The term "fitting with the Lorentz resonance curve" is used to mean conducting a fitting in accordance with the Lorentz theory. This procedure is based on the fact that the Raman light scattered by lattice vibrations (phonons) of atoms or molecules in a solid is expressed generally in a Lorentz-type formula.

Whereas single-crystalline diamonds typically have a diamond peak's FWHM of 3 cm$^{-1}$ or less, the diamond of the present invention has an FWHM of 6 cm$^{-1}$ or more as described above. This suggests that the diamond of the present invention is a diamond akin to graphite.

Figure 3:
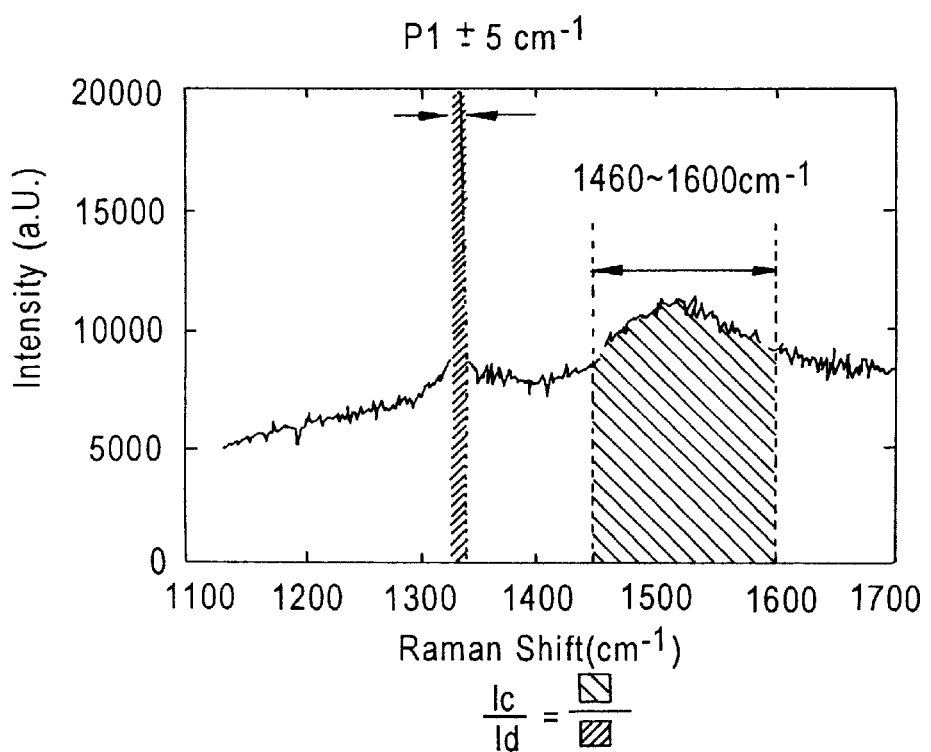
FIG. 3 is a chart showing an example of a spectrum obtained by Raman spectroscopy of the hard carbon film of the present invention.

It is desirable that the ratio of the peak intensity Ic/Id be 4 or more, where Ic is the peak intensity of the carbon clusters, and Id the diamond, in terms of the propagation loss in SAW filters that comprise the hard carbon film of the present invention. FIG. 3 shows the definition, used in the present invention, of the integration range on the Raman spectrum for obtaining the intensities Ic and Id.

Graphite originally has two peaks, one at 1580 cm$^{-1}$ and the other at 1355 cm$^{-1}$, in Raman spectroscopy. It is known, however, that when the crystal becomes infinitesimal, the two peaks converge into one at 1510 cm$^{-1}$. As described above, the hard carbon film 3 of the present invention has the peak only at 1510 cm$^{-1}$. This shows that the hard carbon film 3 comprises carbon clusters that are infinitesimal, allowing them to fill the interstices between the diamond grains.

The Lorentz fitting showed that the magnitude of the FWHM of the peak of the carbon clusters is 170 cm$^{-1}$ or less. (The magnitude of the FWHM signifies the degree of overlapping of the two peaks, one at 1580 cm$^{-1}$ and the other at 1355 cm$^{-1}$.) This also shows that the hard carbon film 3 of the present invention comprises carbon clusters that are infinitesimal, allowing them to fill the interstices between the diamonds grains. Because of such a specific structure, the hard carbon film 3 of the present invention manifests the property of low propagation loss for surface waves.

Referring to FIG. 3, when the ratio of the peak intensity of the carbon clusters to that of the diamond Ic/Id is 4 or more, the hard carbon film 3 contains carbon clusters to a certain extent. If the ratio Ic/Id is less than 4, the properties for surface acoustic waves tend to deteriorate, increasing propagation losses in particular.

When calculated from the Raman spectrum, the relative intensity of the carbon-cluster constituent is about 60 times that of the diamond constituent. Consequently, when the ratio of the relative intensity of the carbon clusters to that of the diamond is 4 or more, the percentage of the carbon clusters is 6.6% or more. Considering the error in the measurements, it can be said that the hard carbon film 3 contains about 5% or more carbon clusters.

The foregoing Raman spectroscopy can be performed suitably under the following conditions:

The conditions of the Raman spectroscopy:

Analytical method: Raman scattering method,

Raman spectroscopy system: DILOR-made, brand name: XY,

Light source: argon laser with a wavelength of 457.92 nm, brand name: NEC GLG3200, Output: 250 mW×10 (microscopic Raman spectroscopy), Focus: to be focused on the surface of the hard carbon film.

Surface Roughness

It is desirable that the hard carbon film of the present invention have a surface roughness (unevenness) of 10 nm or less in terms of yield reduction caused by breaks in wiring.

In the present invention, the term "Ra" stipulated in the Japanese Industrial Standard JIS B-0601 is used for expressing the foregoing "surface roughness." The surface roughness Ra can be measured suitably by the following procedure: The procedure for measuring the surface roughness:

(a) A measured length of 10 μm is sampled by using a device for measuring the center-line average roughness.

(b) The profile curve is turned over at the center line.

(c) The area surrounded by the profile curve and the center line is divided by the measured length of 10 μm.

(d) The obtained value is expressed in μm.

Grain Size

It is desirable that the hard carbon film 3 of the present invention have a grain size comparable to or less than the wavelength of the SAW to be used, in terms of the propagation loss when used in SAW devices. More specifically, it is desirable that the grain size be about 1.0×λ or less when the wavelength of the SAW to be used is expressed by λ, preferably about 4/5×λ or less.

In the present invention, the grain size can be measured suitably by the following procedure:

The procedure for measuring the grain size:

(a) A sample of the hard carbon film 3 that measures 10×10×0.3 mm is prepared.

(b) The sample is annealed at 700° for 1 hour in the atmosphere.

(c) The surface of the hard carbon film 3 is observed through an SEM at 5,000 power.

(d) The magnitude of the diamond grains is measured to calculate the average value.

Thermal Conductivity

In the present invention, it is desirable that the hard carbon film have a thermal conductivity of 2 to 15 W/cmK in terms of the heat dissipation property of the completed SAW device.

In the present invention, the thermal conductivity can be measured suitably by the well-known laser flash method, for example.

In the present invention, the method for growing the hard carbon film has no particular limitations. More specifically, the following well-known growing methods can be used: the chemical vapor deposition(CVD) method, the microwave plasma CVD method, the plasma jet method, the flame method, and the hot filament method.

Piezoelectric Layer

Figure 5:
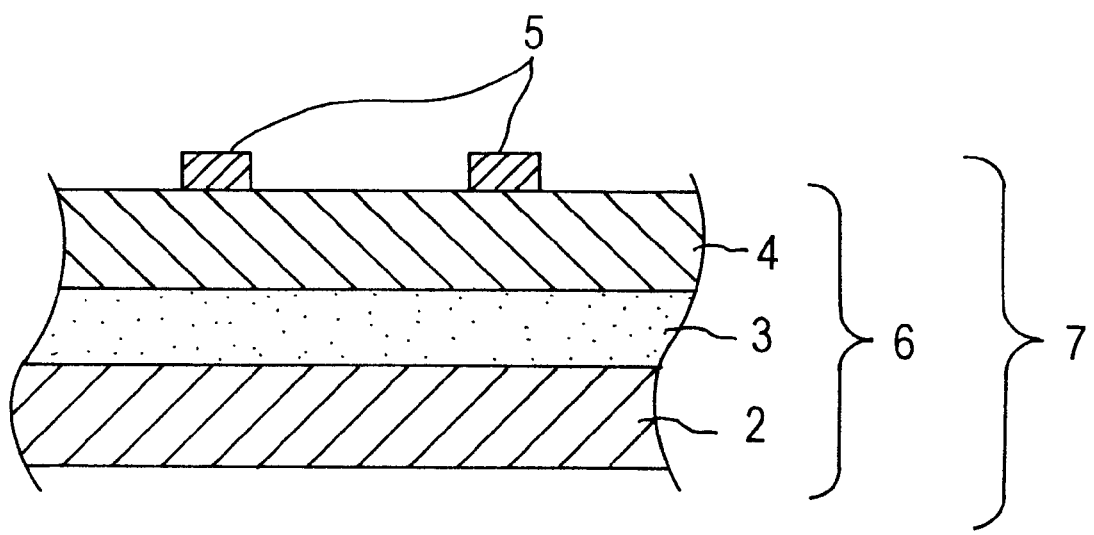
FIG. 5 is a schematic cross section showing an embodiment of a SAW device 7 having electrodes 5 on a SAW substrate 6 of the present invention that mounts a piezoelectric layer 4 on the hard carbon film 3 shown in FIG. 1.

In the present invention, when required, a piezoelectric layer 4 may be formed on the hard carbon film 3 as shown in the schematic cross section in FIG. 5. The following well-known piezoelectric bodies can be used as the piezoelectric layer without specific limitations: ZnO, LiNbO$_3$, LiTaO$_3$, crystal, etc.

The thickness of the piezoelectric layer should be decided in accordance with the type of piezoelectric body used and the required properties of the SAW device; the required properties including the central frequency, the relative band width, and temperature characteristics.

The method for forming the piezoelectric layer 4 has no special limitations. More specifically, the following well-known methods can be used without special limitations: the CVD method, the microwave plasma CVD method, the physical vapor deposition (PVD) method, the spattering method, and the ion-plating method. Of these methods, the spattering method, particularly the RF magnetron spattering method, is favorably used in terms of uniformity, mass productivity, and piezoelectric properties.

Embodiment of a SAW Device

Figure 4:
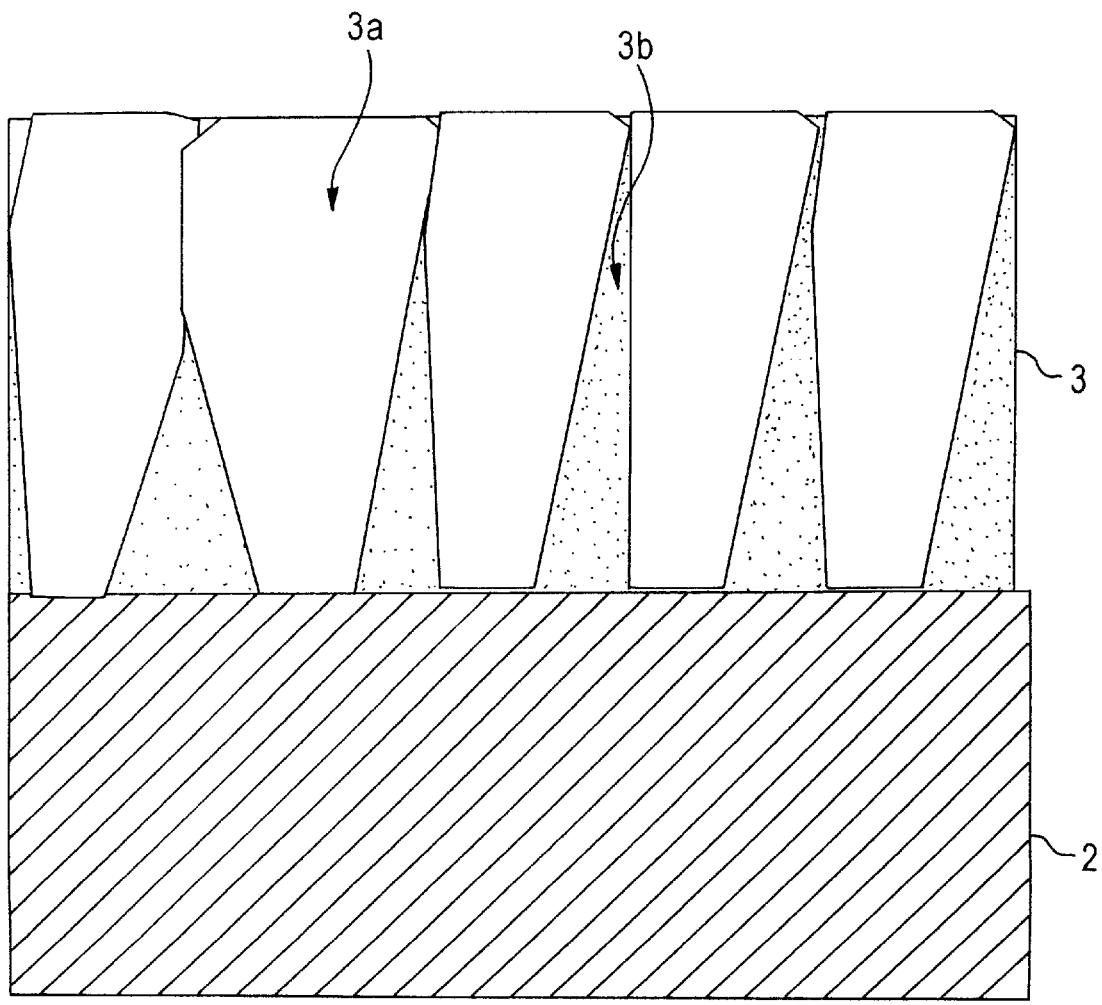
FIG. 4 is a schematic cross section showing an embodiment of a hard carbon substrate having the hard carbon film 3 of the present invention mounted on a base material 2.

FIG. 4 is a schematic cross section of a hard carbon substrate having the hard carbon film 3 of the present invention mounted on a base material 2 made of silicon, for example. As can be seen in FIG. 4, the hard carbon film 3 has carbon clusters 3b in the interstices between the graphite-like diamond grains 3a.

FIG. 5 is a schematic cross section showing an example of the layer configuration in a SAW device 7 having a substrate 6 that comprises the hard carbon film 3 of the present invention. In this embodiment, a well-known piezoelectric layer 4 is mounted on the hard carbon substrate 1 shown in FIG. 4 to provide the SAW substrate 6 of the present invention. Electrodes 5 are provided on the piezoelectric layer 4.

The present invention is further explained specifically by the examples below.

EXAMPLE 1

Figure 6:
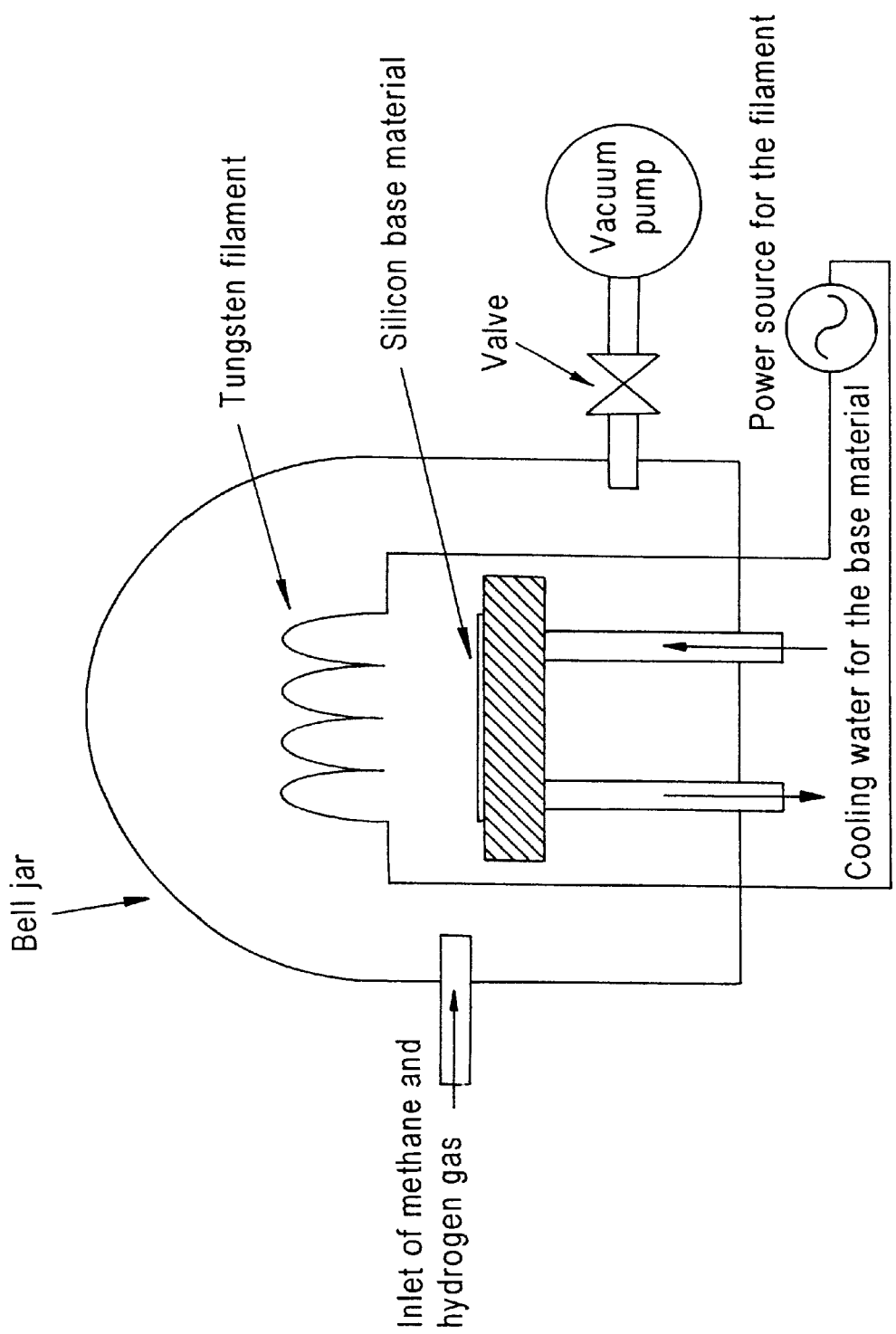
FIG. 6 is a schematic diagram showing the outline of the filament CVD equipment used in Example 1.

A hard carbon film having a thickness of 30 μm is formed on the (100)-oriented surface of an Si base material 350 μm in thickness by using the filament CVD equipment shown in FIG. 6. The conditions employed in the CVD are as follows:

Conditions of the filament CVD method:

Distance between the tungsten filament and the Si base material: 50 mm,

Pressure: 10 torr, (bell jar was evacuated by a vacuum pump to keep the inside pressure in the range of about 10 to 200 torr.)

Flow rate of CH4: 50 SCCM (standard cubic centimeter per minute),

Flow rate of H2: 1,000 SCCM,

Filament temperature: about 2,100° C., (power supply for the filament was adjusted to secure this temperature.)

Base-material temperature: about 750° C. (cooling-water temperature was adjusted to secure this temperature.)

The surface of the hard carbon film obtained was observed through an SEM at 3,000 power. The resultant grain size was tens of micrometers. The X-ray diffraction (using a Cu bulb and θ-2θ scanning method) on the hard carbon film showed the presence of the diamond peaks at the following angles:

43.8° corresponding to (111) plane, 75.8° corresponding to (220) plane, 90.8° corresponding to (311) plane, 119.7° corresponding to (400) plane, and 140.8° corresponding to (331) plane.

Figure 7:
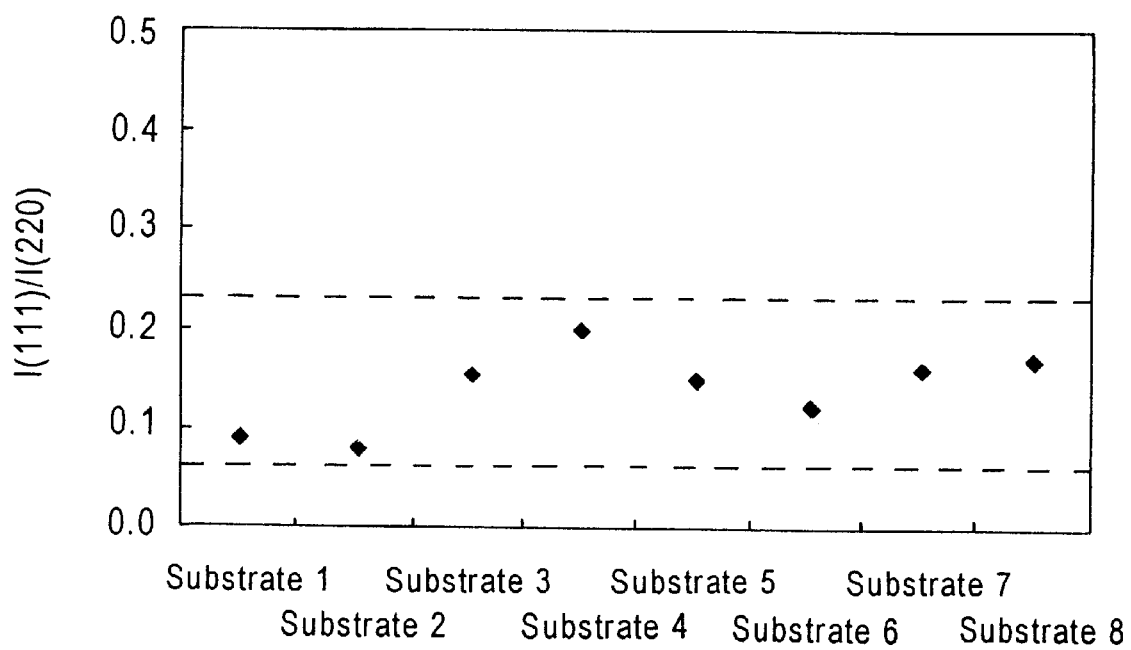
FIG. 7 is a graph showing the orientation ratio I(111)/I(220) of the hard carbon films of the present invention obtained in Example 1.

Eight hard carbon substrates were provided that have a hard carbon film/Si base-material structure produced by the above-described conditions. The intensity of the peak corresponding to the (111) plane was determined by the integration of the X-ray-diffraction result over the range of P3±1°, where P3 is the diffraction angle at which the peak value lies; P3 lies in the range of 43 to 46°. The value obtained by the integration is expressed as I(111). Similarly, the intensity of the peak corresponding to the (220) plane was determined by the integration of the X-ray-diffraction result over the range of P4±1°, where P4 is the diffraction angle at which the peak value lies; P4 lies in the range of 73 to 76°. The value obtained by the integration is expressed as I(220). The values of the ratio of the integrated intensity I(111)/I(220) for individual substrates are all below 0.3 as shown in FIG. 7 and Table 1.

TABLE 1

| Substrate No. | I(111)/I(220) |
| --- | --- |
| 1 | 0.09 |
| 2 | 0.08 |
| 3 | 0.15 |
| 4 | 0.19 |
| 5 | 0.14 |
| 6 | 0.12 |
| 7 | 0.15 |
| 8 | 0.17 |

The Raman spectrum obtained by using an argon laser showed a comparatively low peak at 1333 cm$^{-1}$ (intensity: Id) and a broad peak existing in the Raman shift range of 1530 to 1650 cm$^{-1}$ (intensity: Ic). The ratio of the integrated intensity Ic/Id was 5.

The surface of the hard carbon film obtained was polished with a grinding wheel having natural-diamond abrasives (grain size: 5 to 20 µm) to attain a surface roughness Ra of 20 nm.

1. Formation of the piezoelectric layer

A ZnO layer 1,050 nm in thickness was formed on the samples A and B (a hard carbon film/Si base-material constitution) by RF spattering under the following conditions:

Conditions for forming the ZnO piezoelectric layer:

Substrate: hard carbon film/Si base-material, samples A and B,

Target: ZnO sintered body,

RF power: 500 W (frequency: 13.56 MHz),

Reaction gas: type: Ar+O$_2$, Ar: O$_2$=1:1, flow rate: 50 SCCM,

Gas pressure: 20.0 Pa,

Temperature for the layer formation (substrate temperature): 150°,

Rate of layer formation: 5 nm/min,

Thickness of the layer: 1,050 nm.

ZnO/hard-carbon/Si composites were obtained under these conditions.

2. Formation of an Al layer

An Al layer 80 nm in thickness for electrodes was formed on the ZnO layer by the DC spattering method.

Conditions for forming the Al layer:

DC spattering power: 1.0 kW

Reaction gas: type: Argon gas, flow rate: 50 SCCM,

Gas pressure: 1.0 Pa,

Temperature for the layer formation (substrate temperature): room temperature,

Thickness of the aluminum layer: 80 nm.

Al/ZnO/hard-carbon/Si composites were obtained under these conditions.

3. Formation of interdigital transducers (IDTs)

IDTs having the following parameters were formed by removing part of the aluminum layer with photolithography.

Parameters of the IDTs:

Electrode line length: 0.8 µm (center frequency: 1.75 GHz),

Number of pairs of IDTs: 40-pair double IDTs (normal type),

IDT aperture length: 50×wavelength (wavelength λ is 8 times the electrode line length. λ=6.4 µm.), I/O IDT center distance: 50×wavelength.

The above-described forming process for Al electrodes/ ZnO layer/hard carbon layer/Si base-material composites is illustrated by the schematic cross sections in FIG. 8 (*a*) to FIG. 8 (*e*).

Figure 9:
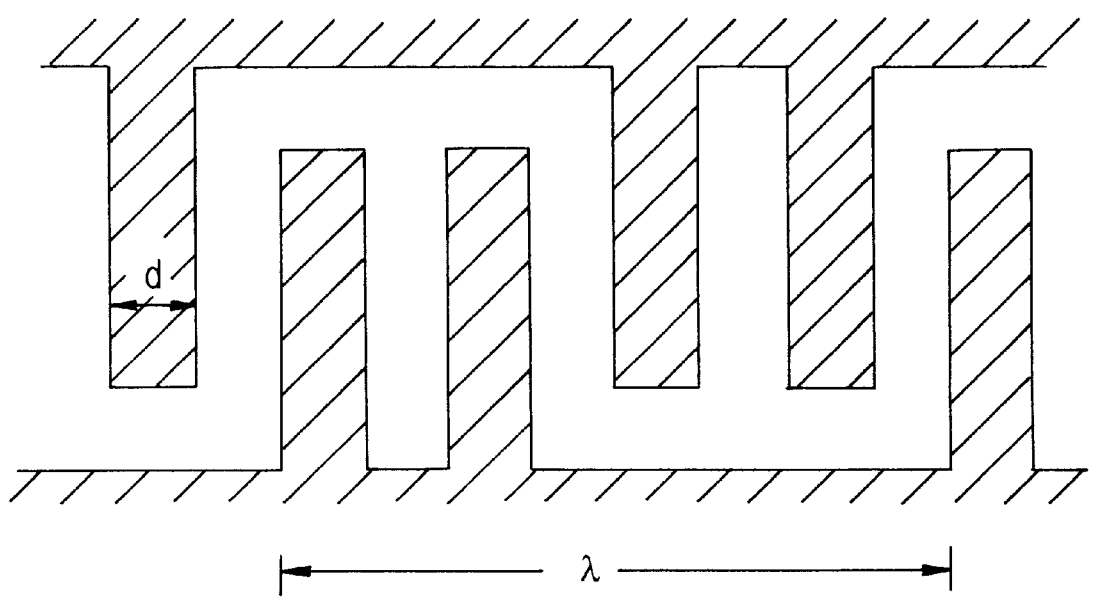
FIG. 9 is a schematic diagram showing the pattern of the interdigital transducers (IDTs) formed in Example 1.

FIG. 9 illustrates the pattern of the IDTs. As illustrated in FIG. 9, narrow pieces of electrodes are arranged on a two-by-two basis. Because four pieces correspond to one wavelength and the blank space has the same length as the narrow piece of electrode, 8 times the electrode line length is equal to the wavelength. The SAW device has two sets of IDT pairs, one on the right-hand side and the other on the left-hand side. One set of IDT pairs is composed of 40 pairs. In this way, SAW devices that have a cross-sectional structure have been fabricated as illustrated in FIG. 8(*e*).

A vector network analyzer (HP8753c) was used to measure propagation losses and conversion losses. High-frequency power 1 to 2 GHz in frequency was applied across the electrodes on one side to obtain S (scattering) parameters by measuring the input power and the power that appears across the electrodes on the other side. S11 represents the reflected power that appears across the electrodes 1 when power is applied across the same electrodes 1. S22 represents the reflected power that appears across electrodes 2 when power is applied across the same electrodes 2. S21 represents the transferred power that appears across the electrodes 1 when power is applied across the electrodes 2 on the other side. S12 represents the transferred power that appears across the electrodes 2 when power is applied across the electrodes 1 on the other side.

Figure 10:
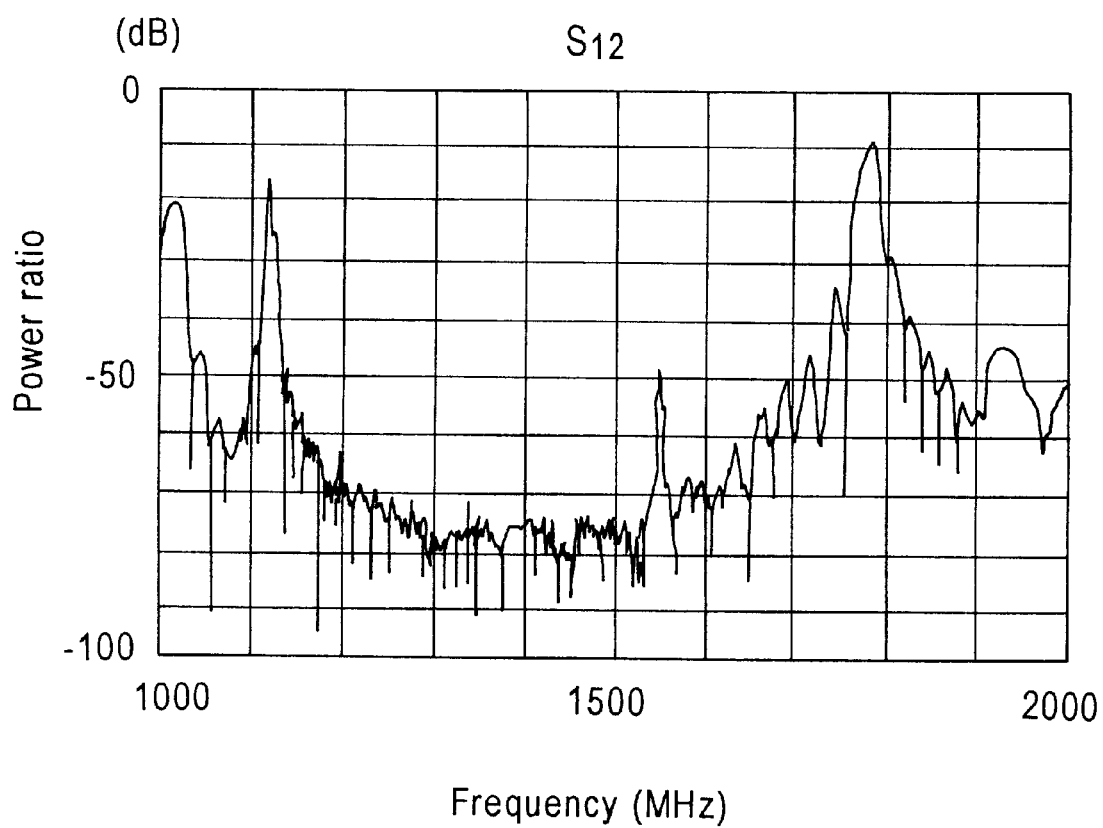
FIG. 10 is a chart showing S12.

FIG. 10 shows S12. The axis of abscissa represents the frequency. The axis of ordinate represents the power of the signal transferred to the electrodes 2, the power being expressed in dB. The transferred power shows a peak (−8.2 dB) at 1.78 GHz. The wavelength λ is determined by the electrodes. The velocity V of surface acoustic waves is determined by the fact that the medium is diamond. Hence, the transferable frequency f=V/λ is uniquely determined. This value is 1.78 GHz. The transferred power is −8.2 dB at this frequency. However, this loss of power includes all the losses such as the resistance loss at the electrodes, the loss resulting from the bidirectional propagation of the signal, and the conversion loss. The propagation loss is obtained by subtracting these losses from the total loss of 8.2 dB.

Figure 11:
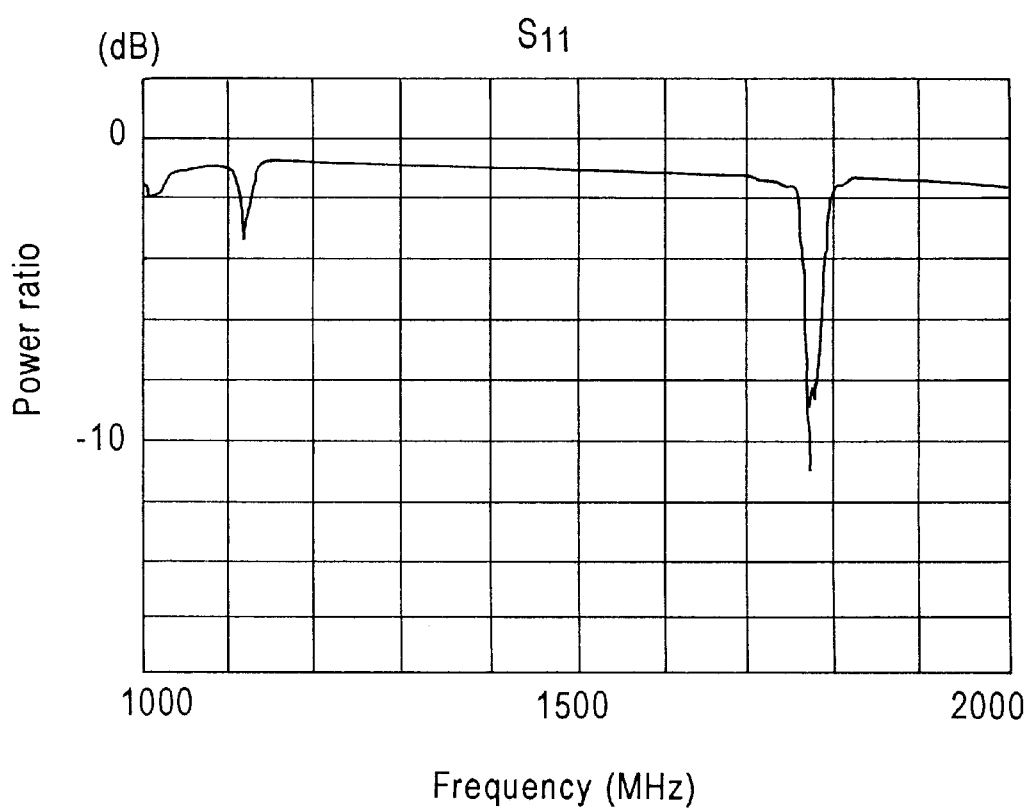
FIG. 11 is a chart showing S11.
Figure 12:
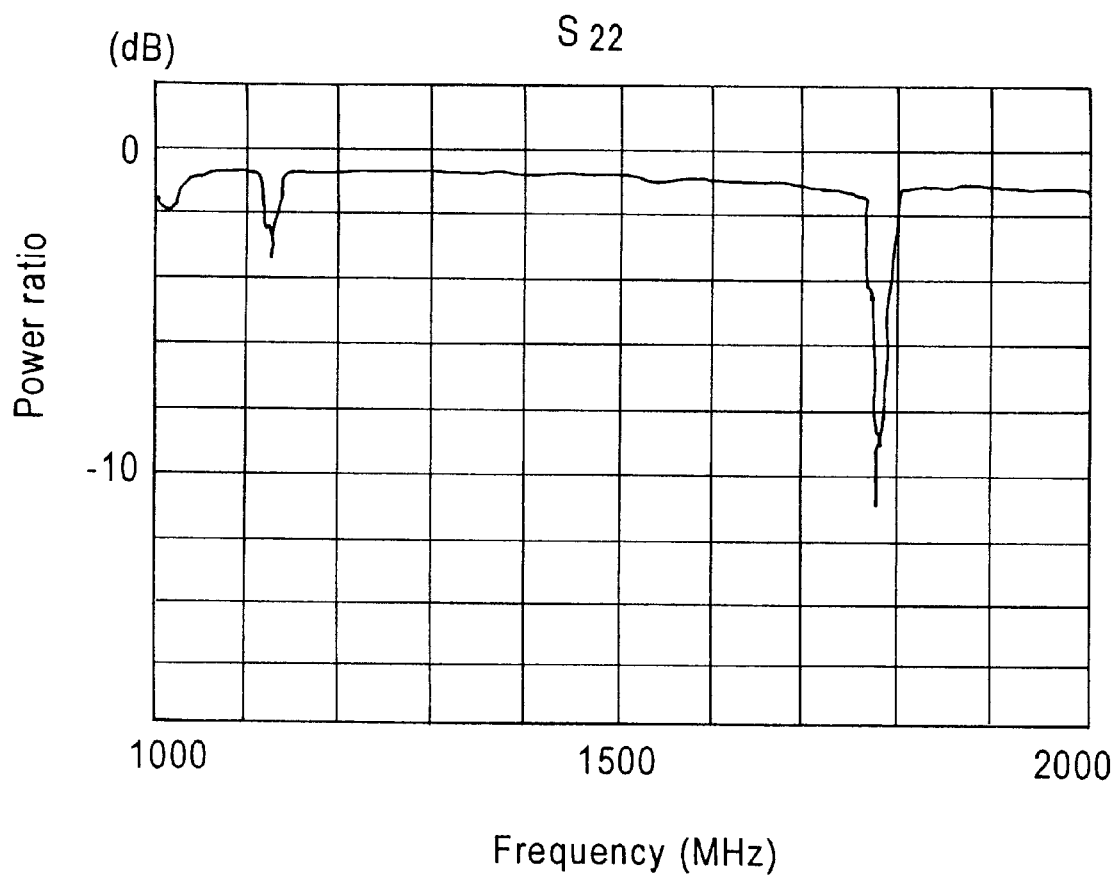
FIG. 12 is a chart showing S22.

The resistance loss can be calculated from the fact that the aluminum electrodes have a thickness of 80 nm and a length of 0.8 µm; the result is 1.0 dB. The bidirectional loss is 6 dB; the loss is caused by the halving of the power because of the bidirectional propagation. FIG. 11 shows S11; FIG. 12 shows S22. The conversion loss is found from the loss (0.3 dB) at the flat portion other than the portion at 1.78 GHz in S11 and S22. Because the loss is produced at both the electrodes, the total conversion loss is 0.6 dB. Since the total loss at the electrodes is 7.6 dB, it is seen that the propagation loss is only 0.6 dB because 8.2−7.6=0.6 dB.

The propagation loss is a loss produced during the propagation of a signal between the opposite electrodes. Since the center distance between the opposite electrodes is 50 times the wavelength, the loss per wavelength is 0.012 dB because 0.6 dB/50=0.012 dB. This is a preeminently small value considering the frequency as high as 1.8 GHz. This demonstrates the superiority of the device that uses the SAW substrate of the present invention.

Figure 13:
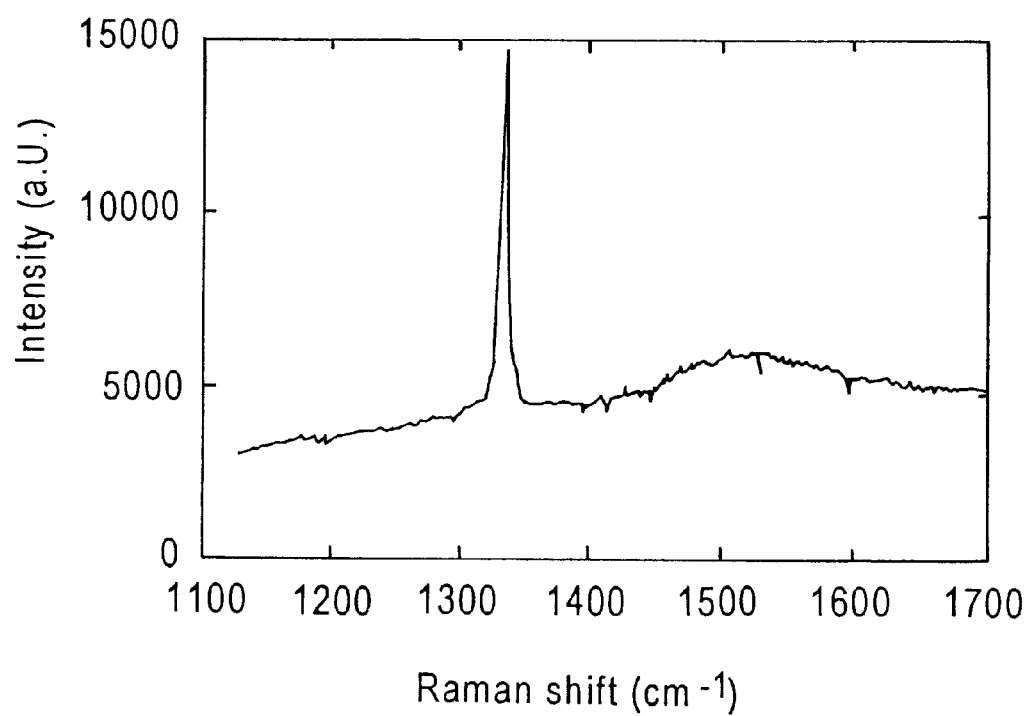
FIG. 13 is a chart showing an example of a Raman spectrum obtained in Example 1.

The hard carbon films obtained were examined by Raman spectroscopy with an argon laser having an oscillation wavelength of 457.92 nm, which is different from the conventionally used wavelength of 514.5 nm. An example of the results is shown in FIG. 13. As can be seen in the chart, only a diamond peak in the vicinity of 1333 cm$^{-1}$ and a peak in the vicinity of 1515 cm$^{-1}$ were observed. Fitting of the diamond peak by the Lorentz resonance curve revealed that the peak has an FWHM of 7 cm$^{-1}$. In other words, the results demonstrate that the hard carbon films have a composite structure of graphite-like diamond and carbon clusters.

EXAMPLE 2

Five hard carbon substrates were fabricated by changing the conditions for forming the hard carbon film from those used in Example 1 in order to change the percentage of the carbon clusters and the property of the hard carbon film, with other conditions unchanged. Particularly, the ratio of methane concentration to hydrogen concentration was changed and varied from 0.5 to 3%. Individual substrates obtained have a hard carbon film 20 μm or more in thickness, proving that they are capable of serving as substrates for SAW devices.

Detailed conditions for forming the hard carbon films are shown in Table 2.

TABLE 2

| Substrate No. | Flow rate of methane (sccm) | Flow rate of hydrogen (sccm) | Base material temperature (° C.) | Time (hour) |
|---|---|---|---|---|
| 9 | 5 | 1000 | 740 | 35 |
| 10 | 10 | 1000 | 750 | 33 |
| 11 | 15 | 1000 | 760 | 30 |
| 12 | 20 | 1000 | 765 | 25 |
| 13 | 30 | 1000 | 770 | 23 |

The hard carbon substrates obtained (5 types) were examined by Raman spectroscopy. Fitting of the diamond peak in the vicinity of 1333 cm$^{-1}$ by the Lorentz resonance curve was conducted to obtain the FWHM of the peak.

Figure 14:
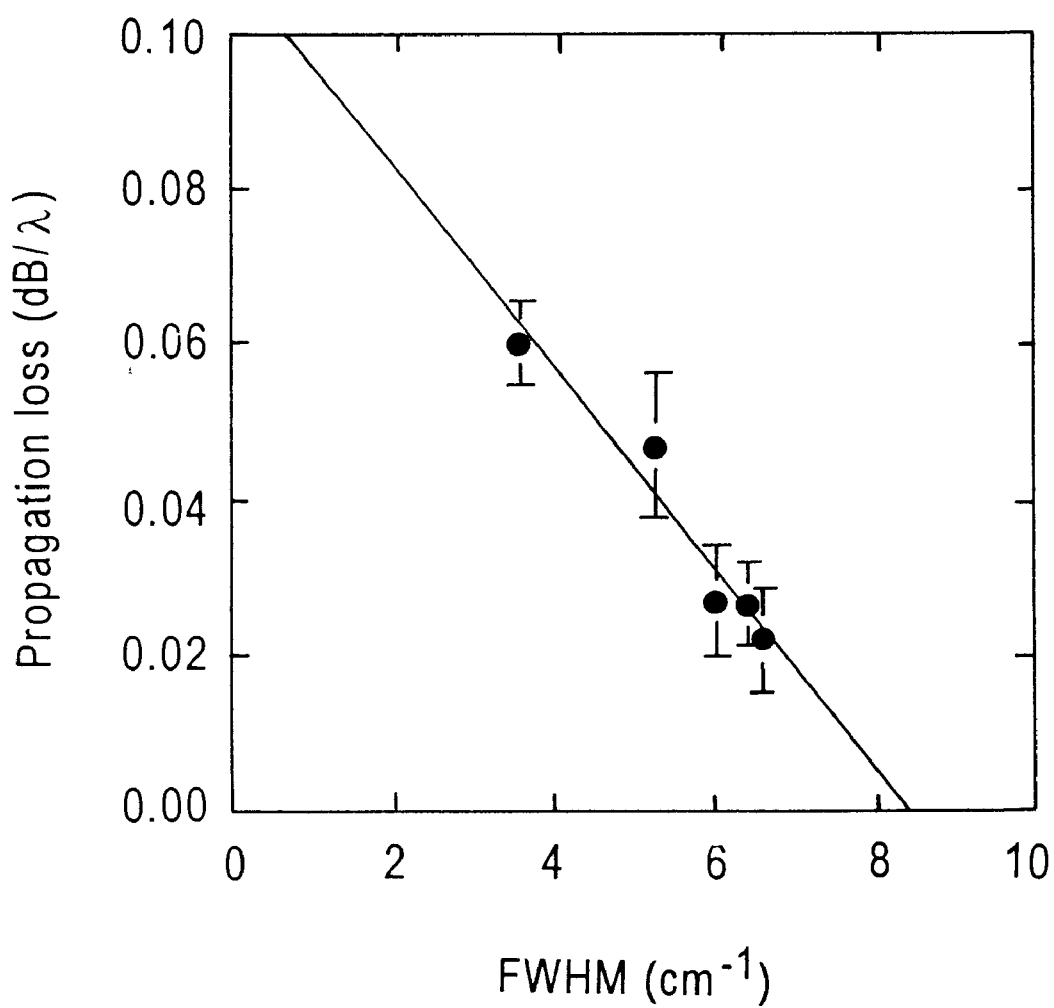
FIG. 14 is a graph showing an example of the relation between the FWHM of the diamond peak and the propagation loss.

As with Example 1, SAW devices (5 types) were fabricated on the hard carbon substrates to measure the propagation loss. The obtained relation between the FWHM of the diamond peak and the propagation loss is shown in FIG. 14. As can be seen in FIG. 14, SAW devices having a diamond peak's FWHM of 6 cm$^{-1}$ or more exhibit desirably low propagation loss.

Figure 15:
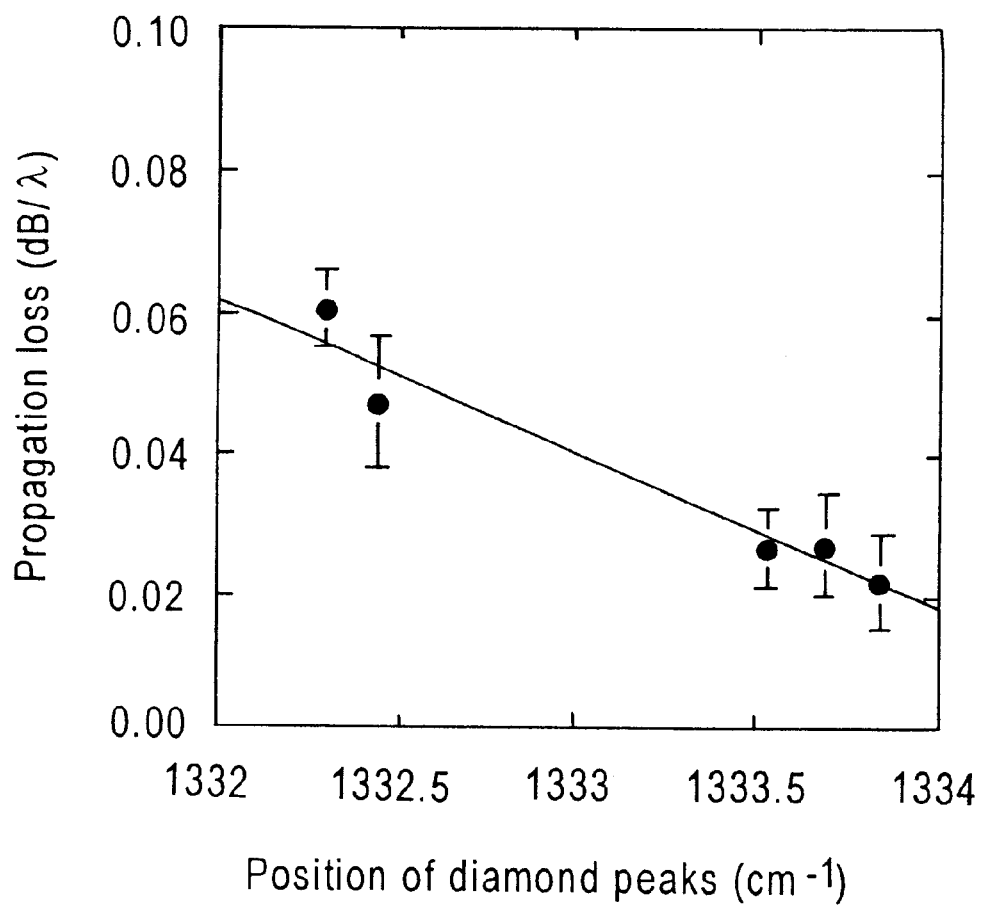
FIG. 15 is a graph showing an example of the relation between the position of the diamond peak on the cm$^{-1}$ scale and the propagation loss.

The fitting by the Lorentz resonance curve also showed the exact position of the diamond peaks on the Raman shift scale. The obtained relation between the position of the diamond peak and the propagation loss is shown in FIG. 15.

Figure 16:
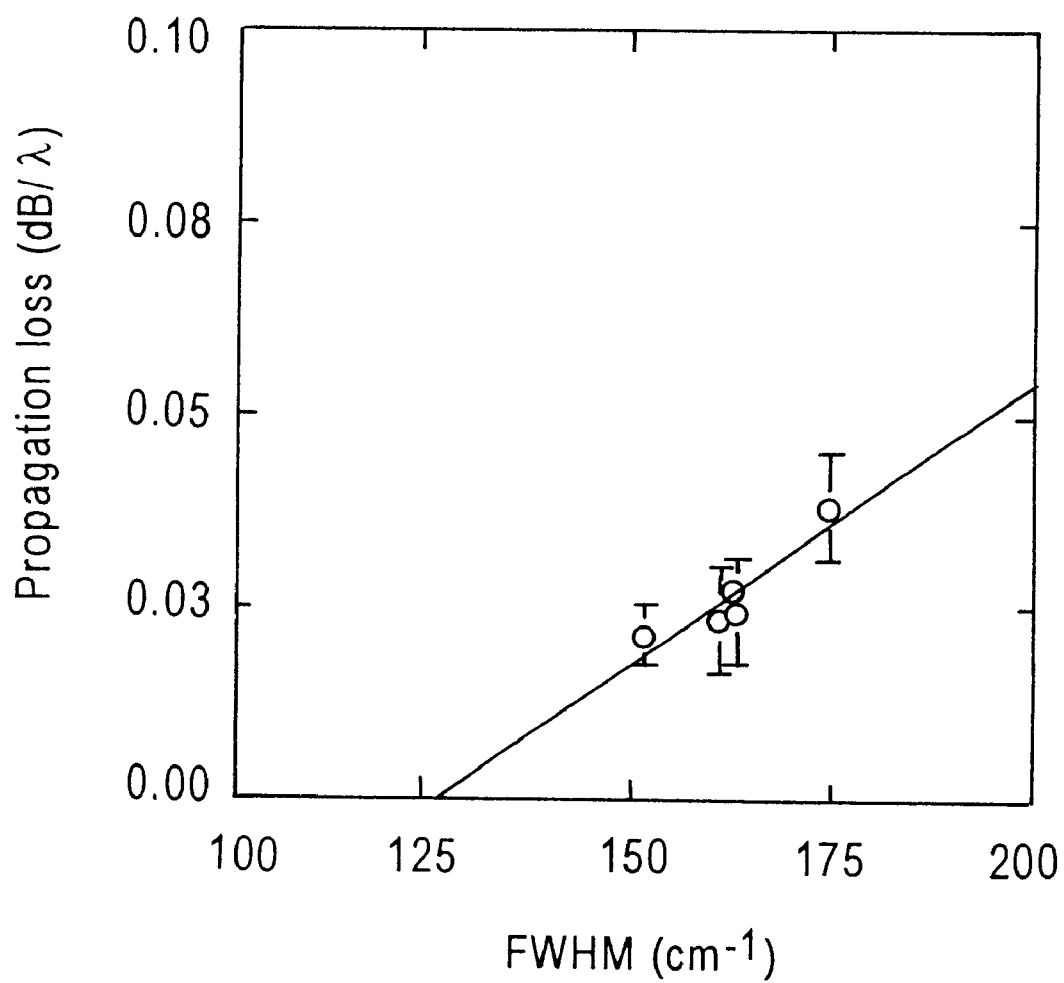
FIG. 16 is a graph showing an example of the relation between the FWHM of the carbon-cluster peak and the propagation loss.

Fitting of the carbon-cluster peak in the vicinity of 1515 cm$^{-1}$ by the Lorentz resonance curve was also conducted to obtain the FWHM of the peak. The obtained relation between the FWHM of the carbon-cluster peak and the propagation loss is shown in FIG. 16. As can be seen in FIG. 16, SAW devices having a carbon-cluster peak's FWHM of 170 cm$^{-1}$ or less exhibit desirably low propagation loss.

Figure 17:
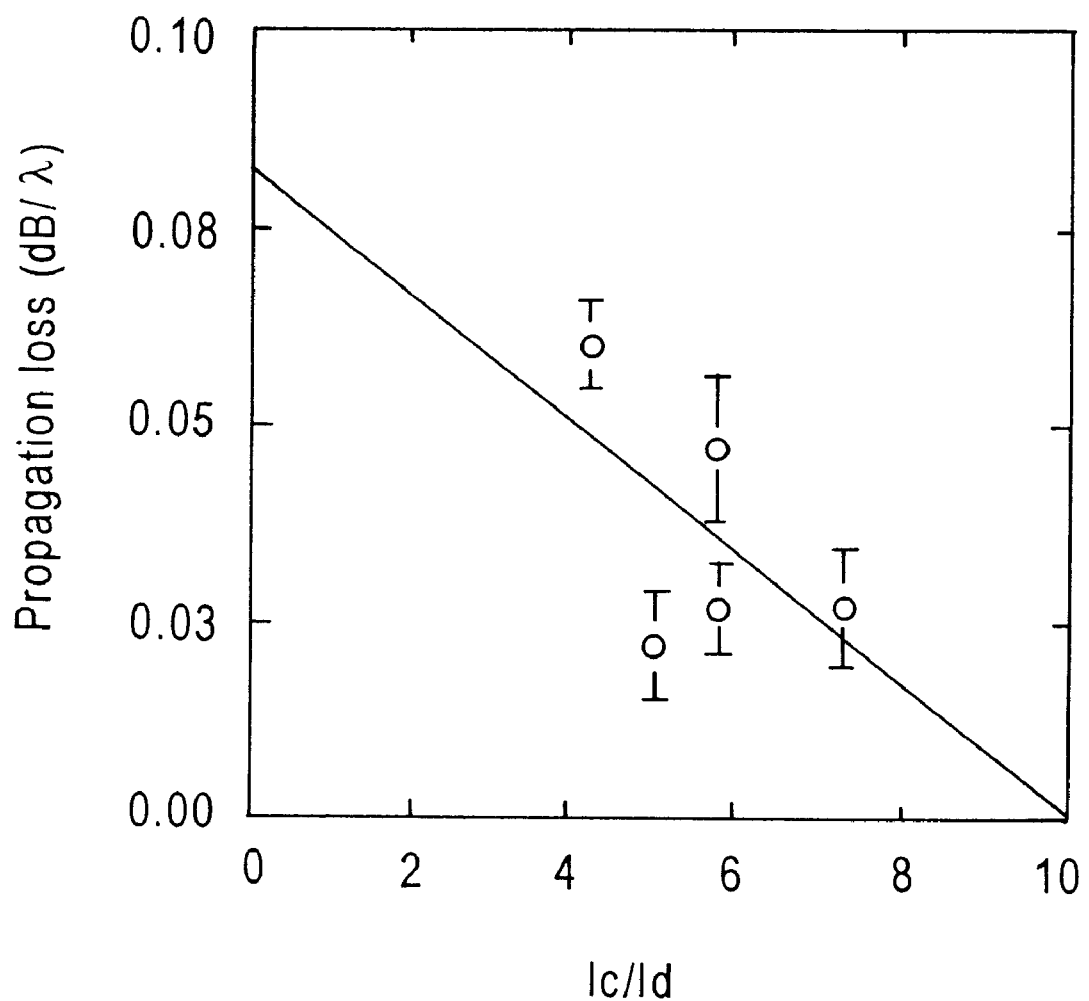
FIG. 17 is a graph showing an example of the relation between the ratio of the integrated intensity Ic/Id and the propagation loss.

The integrated intensity Ic of the carbon clusters was determined by the integration of the Raman spectrum over the range of P2±35 cm$^{-1}$, where P2 is the Raman shift at which the peak value lies; P2 lies in the vicinity of 1515 cm$^{-1}$. Similarly, the integrated intensity Id of the diamonds was determined by the integration of the Raman spectrum over the range of P1±5 cm$^{-1}$, where P1 is the Raman shift at which the peak value lies; P1 lies in the vicinity of 1333 cm$^{-1}$. Subsequently, the ratio of the integrated intensity Ic/Id was Calculated. The obtained relation between the Ic/Id and the propagation loss is shown in FIG. 17. As can be seen in FIG. 17, SAW devices having an Ic/Id ratio of 4 or more exhibit desirably low propagation loss.

What is claimed is:

1. A SAW substrate comprising at least:

a base material;

a hard carbon film composed of a combined film of graphite-like diamond and carbon clusters, being mounted on the base material, wherein:

(1) a crystalline structure in said combined film is continuous, that is, interstices between grains of said graphite-like diamond are filled with said carbon clusters;

(2) the graphite-like diamond has a peak in the range of 1333 to 1335 cm$^{-1}$ in Raman spectroscopy using an argon laser beam whose wavelength is 457.92 nm and the peak has a FWHM of 6 cm$^{-1}$ or more;

(3) the carbon clusters have only one peak in the range of 1500 to 1520 cm$^{-1}$ in Raman spectroscopy using an argon laser beam whose wavelength is 457.92 nm, and the peak has a FWHM of 170 cm$^{-1}$ or less; and (4) the hard carbon film has an Ic/Id ratio of 4 or more wherein the integrated intensity is Id when the peak by Raman spectroscopy for the graphite-like diamond, that is, the position P1=1333 to 1335 cm$^{-1}$, at which the peak value exists, is integrated with respect to the range of P1±5 cm$^{-1}$, and the integrated intensity is Ic when the peak by Raman spectroscopy for the carbon clusters, that is, the position P2=1500 to 1520 cm$^{-1}$, at which peak value exists, is integrated with respect to the range of P2±cm$^{-1}$; and a piezoelectric film mounted on the hard carbon film.

2. A SAW substrate as defined in claim 1, wherein the piezoelectric film comprises a piezoelectric body selected from the group consisting of ZnO, LiNbO$_3$, LiTaO$_3$, and KNbO$_3$.

3. A SAW substrate as defined in claim 1, wherein the base material comprises Si.

* * * * *